(12) United States Patent
Pan et al.

(10) Patent No.: US 10,658,258 B1
(45) Date of Patent: May 19, 2020

(54) CHIP PACKAGE AND METHOD OF FORMING THE SAME

(71) Applicant: Taiwan Semiconductor Manufacturing Co., Ltd., Hsinchu (TW)

(72) Inventors: Kuo-Lung Pan, Hsinchu (TW); Hao-Yi Tsai, Hsinchu (TW); Tin-Hao Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/281,094

(22) Filed: Feb. 21, 2019

(51) Int. Cl.
*H01L 23/31* (2006.01)
*H01L 21/56* (2006.01)
(Continued)

(52) U.S. Cl.
CPC .......... *H01L 23/31* (2013.01); *H01L 21/4853* (2013.01); *H01L 21/4857* (2013.01); *H01L 21/565* (2013.01); *H01L 21/568* (2013.01); *H01L 23/147* (2013.01); *H01L 23/15* (2013.01); *H01L 23/28* (2013.01); *H01L 23/293* (2013.01); *H01L 23/3107* (2013.01); *H01L 23/3114* (2013.01); *H01L 23/3121* (2013.01); *H01L 23/3128* (2013.01); *H01L 23/481* (2013.01); *H01L 23/522* (2013.01); *H01L 23/528* (2013.01); *H01L 23/5226* (2013.01); *H01L 23/5283* (2013.01); *H01L 23/5383* (2013.01); *H01L 23/5386* (2013.01);
(Continued)

(58) Field of Classification Search
CPC ....... H01L 23/12; H01L 23/13; H01L 23/147; H01L 23/15; H01L 23/28; H01L 23/293; H01L 23/31; H01L 23/3107; H01L 23/3114; H01L 23/3121; H01L 23/48; H01L 23/481; H01L 23/482; H01L 23/52; H01L 23/522; H01L 23/5226; H01L 23/528; H01L 23/5283
See application file for complete search history.

(56) References Cited

U.S. PATENT DOCUMENTS 7,619,901 B2 * 11/2009 Eichelberger ....... H01L 21/6835 361/763
8,168,470 B2 * 5/2012 Lin ....................... H01L 21/486 438/107

(Continued)

*Primary Examiner* — Eduardo A Rodela
(74) *Attorney, Agent, or Firm* — JCIPRNET

(57) ABSTRACT

A chip package including a first semiconductor die, a support structure and a second semiconductor die is provided. The first semiconductor die includes a first dielectric layer and a plurality of conductive vias, the first dielectric layer includes a first region and a second region, the conductive vias is embedded in the first region of the first dielectric layer; a plurality of conductive pillars is disposed on and electrically connected to the conductive vias. The second semiconductor die is stacked over the support structure and the second region of the first dielectric layer; and an insulating encapsulant encapsulates the first semiconductor die, the second semiconductor die, the support structure and the conductive pillars, wherein the second semiconductor die is electrically connected to the first semiconductor die through the conductive pillars.

20 Claims, 11 Drawing Sheets

(51) Int. Cl.
  *H01L 23/00*    (2006.01)
  *H01L 23/538*   (2006.01)
  *H01L 21/48*    (2006.01)
  *H01L 23/29*    (2006.01)
  *H01L 23/48*    (2006.01)
  *H01L 23/15*    (2006.01)
  *H01L 23/28*    (2006.01)
  *H01L 23/522*   (2006.01)
  *H01L 23/14*    (2006.01)
  *H01L 23/528*   (2006.01)

(52) U.S. Cl.
  CPC ........ *H01L 23/5389* (2013.01); *H01L 23/562* (2013.01); *H01L 24/19* (2013.01); *H01L 24/20* (2013.01); *H01L 2224/214* (2013.01); *H01L 2924/3511* (2013.01); *H01L 2924/35121* (2013.01)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,543,373 B2* | 1/2017 | Liang | H01L 28/10 |
| 9,735,079 B2* | 8/2017 | Hu | H01L 23/49838 |
| 9,824,902 B1* | 11/2017 | Hou | H01L 25/0655 |
| 2004/0026789 A1* | 2/2004 | Michii | H01L 25/0657 257/777 |
| 2009/0001542 A1* | 1/2009 | Kim | H01L 23/3128 257/686 |
| 2012/0056316 A1* | 3/2012 | Pagaila | H01L 24/96 257/737 |
| 2014/0203457 A1* | 7/2014 | Kim | H01L 25/18 257/778 |
| 2016/0118326 A1* | 4/2016 | Kwon | H01L 21/4853 257/621 |
| 2016/0300817 A1* | 10/2016 | Do | H01L 25/50 |
| 2018/0211936 A1* | 7/2018 | Chang | H01L 24/96 |
| 2019/0221543 A1* | 7/2019 | Sung | H01L 25/0652 |
| 2019/0312018 A1* | 10/2019 | Lai | H01L 23/5383 |

* cited by examiner

CHIP PACKAGE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. With the growing demand for compactness, higher speed, greater bandwidth and high energy efficiency, there is a need for smaller and more creative packaging for integrating multiple chips into a single package. Die stacking is commonly used when packaging multiple chips into a package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
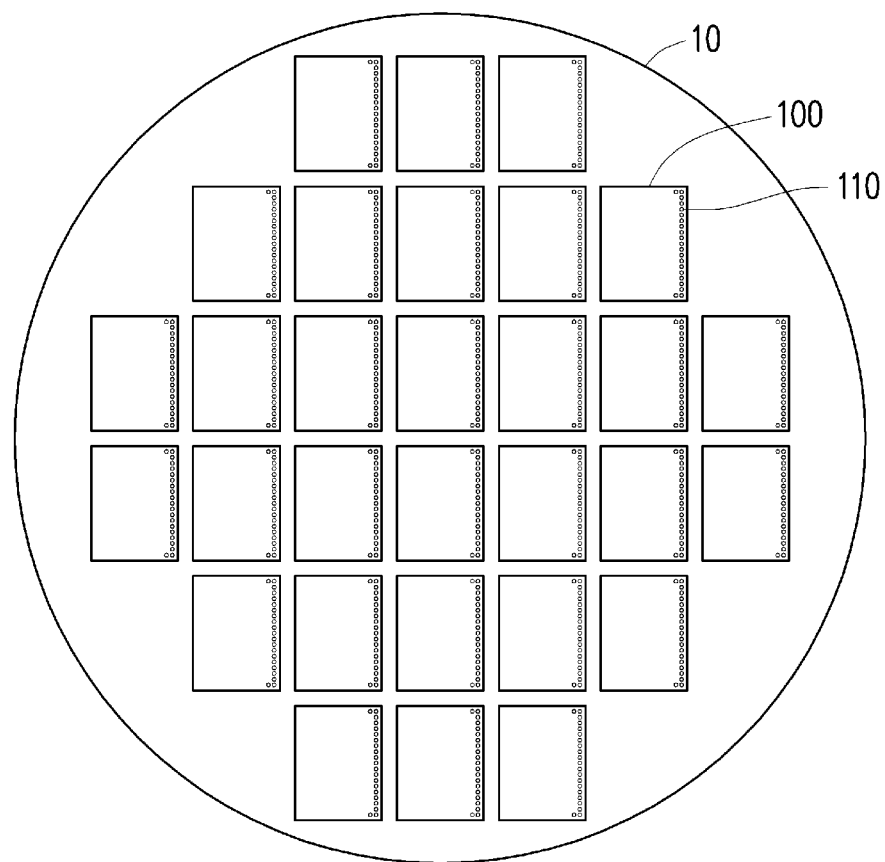
FIG. 1 illustrates a top view of a semiconductor wafer including semiconductor dies in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 illustrates a top view of a semiconductor wafer 10 including multiple semiconductor dies 100 in accordance with some embodiments. In each of semiconductor dies 100, conductive vias 110 connected to peripheral input/output (I/O) pads of the semiconductor die 100 are aligned on the edge region of the semiconductor die 100. Particularly, the conductive vias 110 are aligned along and near to an edge (e.g., the right edge) of the semiconductor die 100. In some embodiments, the conductive vias 110 are arranged along any one of the other edges of the semiconductor die 100. Details of the conductive vias 110 will be further discussed with reference to FIGS. 2 through 6 below.

The semiconductor die 100 may be a memory die (e.g. high bandwidth memory (HBM) die, dynamic random access memory (DRAM) die, static random access memory (SRAM) die etc.). In some embodiment, the semiconductor die 100 may be a graphical processing unit (GPU) die. In some embodiments, semiconductor dies 100 may be power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. In some embodiments, the semiconductor die 100 may be any semiconductor die which has a low I/O count such that all the conductive vias 110 connected to the I/Os can be aligned along an edge region of the semiconductor die 100. The edge region may be a narrow straight edge region or a narrow L-shaped edge region along the edge of the semiconductor die 100, having an area of between about 1% to about 50% of the total top surface area of the semiconductor die 100.

Figure 2:
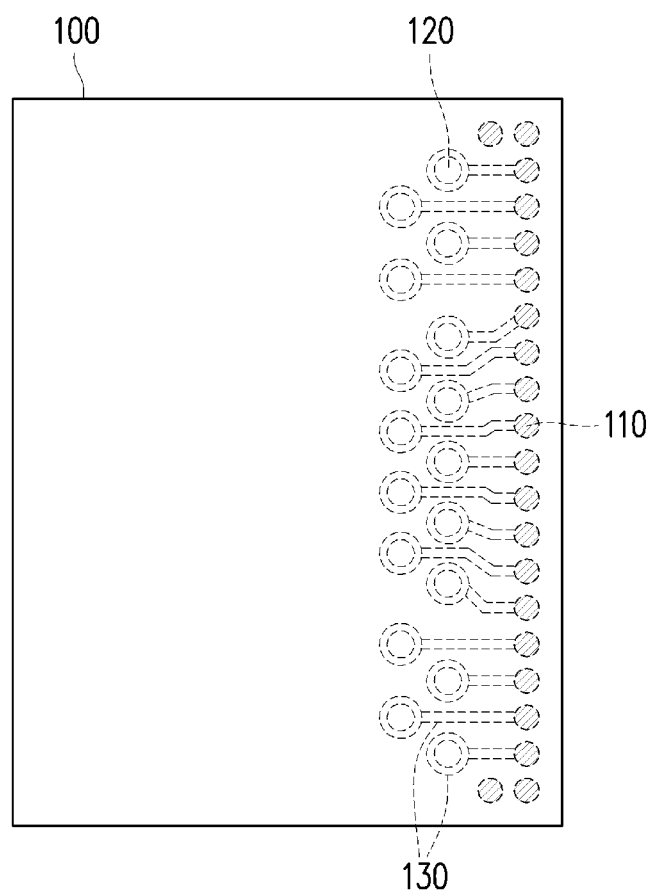
FIG. 2 illustrates a top view of a semiconductor die in accordance with some embodiments.
Figure 7:
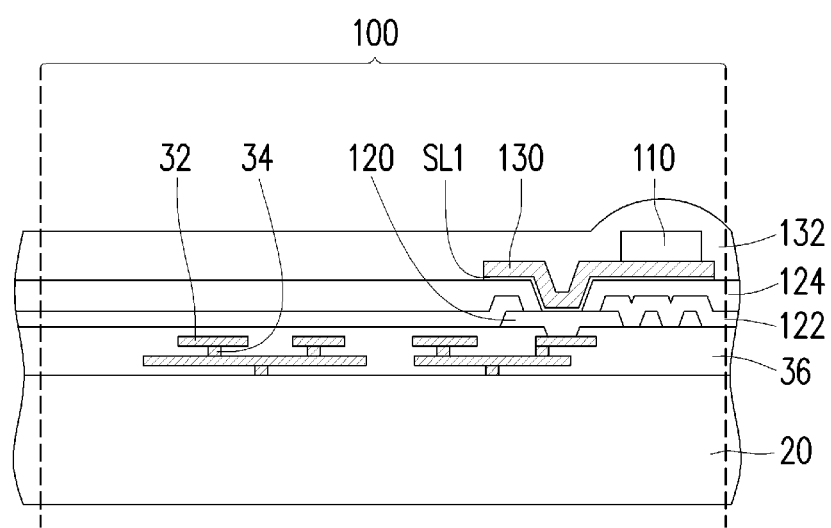

FIG. 2 shows the top view of an enlarged semiconductor die 100 of FIG. 1. The semiconductor wafer 10 and semiconductor die 100 shown in FIGS. 1 and 2 correspond to top view of a semiconductor die 100 after the formation of conductive vias 110 and dielectric layer 132. As described above, the semiconductor vias 110 are aligned along the right edge of the semiconductor die 100. The semiconductor vias 110 are disposed on conductive lines 130 and are electrically connected to conductive pads 120 through the conductive lines 130. The conductive lines 130, conductive pads 120 and conductive vias 110 is be covered by a dielectric layer 132 (as illustrated in FIG. 7) and hence represented by dashed outline. The conductive lines 130 are used to reroute electrical connection from the conductive pads 120 to the edge region of the semiconductor die 100. The conductive pads 120 may also be referred to as I/O pads of the semiconductor die 100 for the purpose of receiving/sending electrical signals from/to the external environment.

Figure 3:
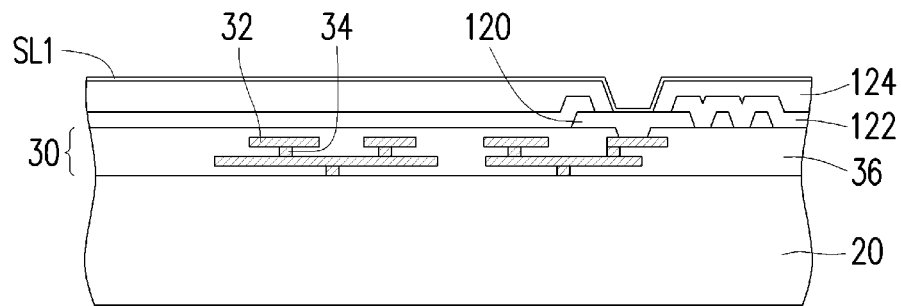
FIGS. 3 through 7 illustrate cross-sectional views of various processing steps during formation of a semiconductor die in accordance with some embodiments.

FIGS. 3 through 7 illustrate cross-sectional views of various processing steps performed on the semiconductor wafer 10 of FIG. 1 during formation of the semiconductor dies 100 (shown in FIG. 7). Referring to FIG. 3, a semiconductor substrate 20 including an interconnect structure 30, conductive pads 120, a passivation layer 122, a dielectric layer 124 and a seed layer SL1 formed thereover is provided. The semiconductor substrate 20 may be a silicon substrate including active components (e.g., transistors or the like) and passive components (e.g., resistors, capacitors, inductors or the like). The active components and passive components (not shown) are formed in or on the front side of the semiconductor substrate 20.

The interconnect structure 30 is formed over the front side of the semiconductor substrate 20. The interconnect structure 30 includes dielectric 36 and interconnection metal layers 32 and 34 embedded in the dielectric 36. The interconnection metal layers 32 and 34 may include multiple layers of metal lines 32 that are electrically connected to one another by metal vias 34 disposed between the layers of metal lines 32. The interconnect structure 30 are formed over the front side of semiconductor substrate 20 to interconnect the active components and/or passive components of the semiconductor substrate 20. At the same time, the interconnect structure 30 re-layouts the metal interconnections towards right edge of the semiconductor die 100. That is, the metal lines 32 and metal vias 34 routes the metallic interconnection towards the right edge of the semiconductor die 100.

As shown in FIG. 3, the conductive pads 120 are formed over the interconnect structure 30. The conductive pads 120 are electrically coupled to the interconnection metal layers 32 and 34 to electrically connect to the semiconductor substrate 20 through the interconnect structure 30. The conductive pads 120 may be aluminum pads, copper pads or other suitable metal pads.

The passivation layer 122 is formed over the interconnect structure 30 and over the conductive pads 120. The passivation layer 122 is patterned to have a plurality of contact openings that partially reveals the conductive pads 120. The passivation layer 122 may be patterned through a photolithography process. The passivation layer 122 may be a silicon oxide layer, a silicon nitride layer, a silicon oxynitride layer or a dielectric layer formed by other suitable inorganic dielectric materials. The passivation layer 122 is formed by a process that may include chemical vapor deposition (CVD), physical vapor deposition (PVD), atomic layer deposition (ALD), combinations thereof, or another suitable process. The passivation layer 122 provides a protection function so that the structures formed thereunder are less likely to be damaged by subsequently performed processes.

The dielectric layer 124 is formed over the passivation layer 122 and into the opening of the passivation layer 122 to cover the partially revealed conductive pads 120. The dielectric layer 124 is then patterned to form via openings partially revealing the conductive pads 120. The via openings formed in the dielectric layer 124 partially reveals the contact openings of the passivation layer 122. In some embodiments, the via openings may be formed to have a tapered shape in the cross-sectional view, and the via openings may be tapered to have a smaller diameter near the conductive pads 120. In some embodiments, dielectric layer 124 may be a polyimide (PI) layer, a polybenzoxazole (PBO) layer, or a dielectric layer formed by other suitable organic dielectric materials. In some embodiments, the dielectric layer 124 is formed by any acceptable deposition process, such as spin coating, chemical vapor deposition (CVD), laminating, the like, or a combination thereof, and is patterned through a photolithography process.

The seed layer SL1 is then formed on the patterned dielectric layer 124 and the revealed portions of the conductive pads 120. That is, the seed layer SL1 is formed on the dielectric layer 124 conformal to the shape of the via openings. The seed layer SL2 may be formed using, for example, PVD or the like. The PVD may be sputtering. In some embodiments, the seed layer SL1 is a metal layer, which may be a single layer or a composite layer comprising sub-layers formed of different materials. In some embodiments, the seed layer SL1 includes a titanium layer and a copper layer over the titanium layer.

Figure 4:
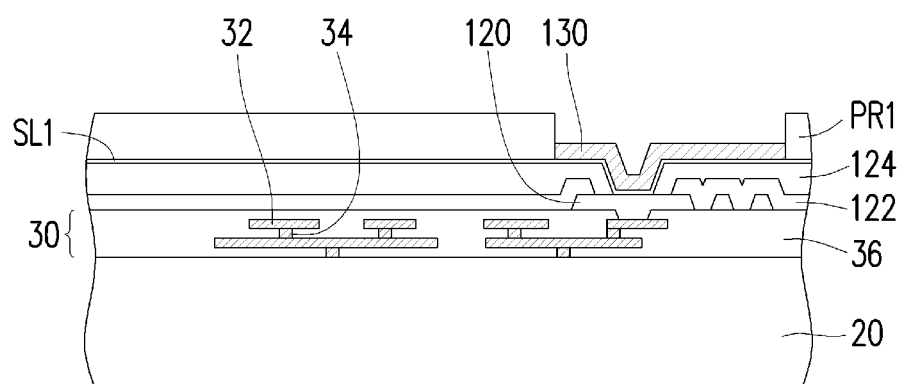

Referring to FIG. 4, after the seed layer SL1 is formed, a photoresist PR1 is then formed over the seed layer SL1 and patterned. The photoresist PR1 is patterned to form a plurality of trenches (or openings) above the conductive pads 120. The plurality of trenches partially reveals the seed layer SL1. In some embodiment, the plurality of trenches completely overlaps the conductive pads 120 in the direction perpendicular to the top surface of the conductive pads 120. The pattern of the trenches defines the shape of the conductive lines that will formed therein in a later processing stage. For example, the pattern of the trenches may correspond to the shape of the outer dashed lines of FIG. 2.

After the photoresist PR1 is formed and patterned, a conductive material is then formed in the trenches of the photoresist PR1 and on the exposed portions of the seed layer SL1 such that conductive lines 130 are formed on the exposed portions of the seed layer SL1. The conductive lines 130 may be formed by plating, such as electroplating, electroless plating, or the like. The conductive lines 130 may have a thickness of between about 1 μm to about 30 μm, and a width of between about 0.5 μm to about 50 μm. In some embodiments, the conductive lines 130 are formed of a metal such as copper, titanium, tungsten, aluminum, or the like. In some embodiments, the conductive lines 130 is formed as a final routing process in order to be closer to the right edge of the semiconductor die 100.

Figure 5:
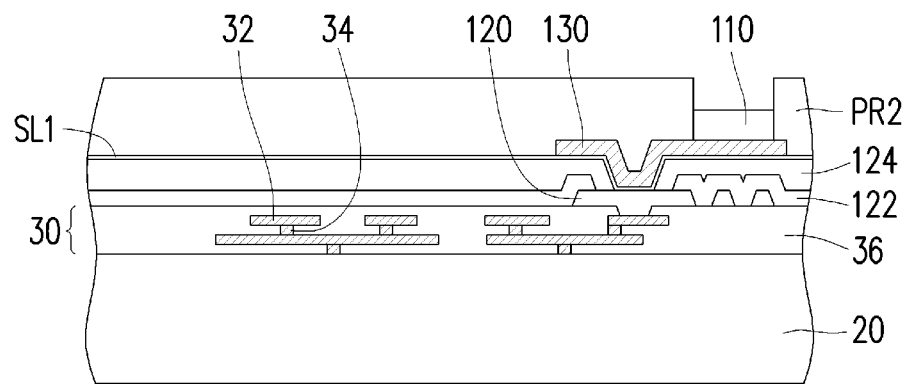

In FIG. 5, the photoresist PR1 is removed. In some embodiments, the photoresist PR1 may be removed by any acceptable process, such as by an ashing process, a stripping process, or the like. After the photoresist PR1 is removed, another photoresist PR2 is formed over the seed layer SL1 and the conductive lines 130. The photoresist PR2 is then patterned to form via openings to reveal the right end portion of the conductive lines 130. A conductive material is then formed in the via openings of the photoresist PR2 and on the exposed portions of the conductive lines 130 such that conductive vias 110 are formed on the conductive lines 130. In some embodiments, the conductive via 110 may be between about 0.01 mm to about 1 mm from the right edge of the semiconductor die 100. The conductive vias 110 may have a thickness of between about 50 μm to about 200 μm. In some embodiments, the conductive vias 110 are formed of a metal such as copper, titanium, tungsten, aluminum, or the like. In some embodiment, the photoresist PR2 is also patterned to form via openings to reveal portions of the seed layer SL1, and conductive materials may be provided therein to form dummy vias.

Figure 6:
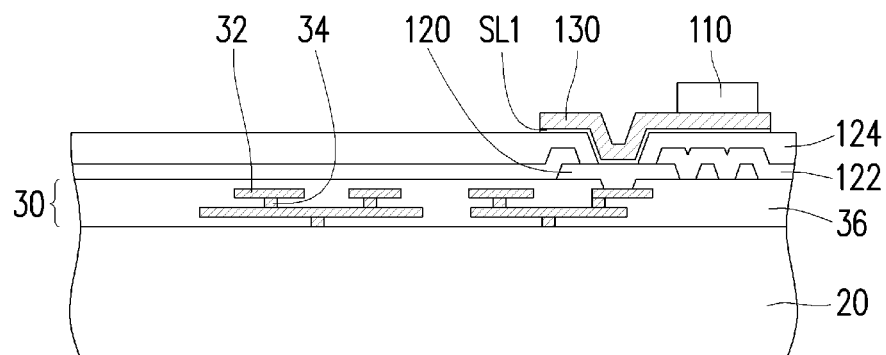

In FIG. 6, the photoresist PR2 is removed and portions of the seed layer SL1 which are not covered by the conductive materials (i.e., the conductive lines 130) are also removed. In some embodiments, the photoresist PR2 may be removed by any acceptable process, such as by an ashing process, a stripping process, or the like. After the photoresist PR2 is removed, the exposed portion of the seed layer SL1 may then be removed by any acceptable process. In some embodiments, the exposed portion of the seed layer SL1 may be removed by etching process such as wet etching, dry etching, or the like.

In FIG. 7, a dielectric layer 132 is formed to cover the dielectric layer 124, the conductive lines 130 and conductive vias 110. Due to the topography of conductive vias 110, the dielectric layer 132 may have a plurality of protruding features corresponding to the conductive vias 110 disposed thereunder. In some embodiments, the dielectric layer 132 may be a polyimide (PI) layer, a polybenzoxazole (PBO) layer, or a dielectric layer formed by other suitable dielectric materials. In some embodiments, the dielectric layer 132 is formed by any acceptable deposition process, such as spin coating, chemical vapor deposition (CVD), laminating, the like, or a combination. In some embodiments, the dielectric layer 132 covers the top surface of the conductive via 110. After forming the dielectric layer 132, a wafer dicing process is performed on the wafer 10 along the scribe lines (dashed lines shown in FIG. 7) such that singulated semiconductor dies 100 are obtained.

FIGS. 8 through 11 illustrate cross-sectional views of various processing steps during formation of a chip package including the singulated semiconductor die 100, a dummy die 200 and a semiconductor die 300 on a carrier C1 in accordance with some embodiments. A single chip package region is illustrated in FIGS. 8 through 11, but multiple chip packages may be packaged simultaneously on a carrier C1.

Figure 8:
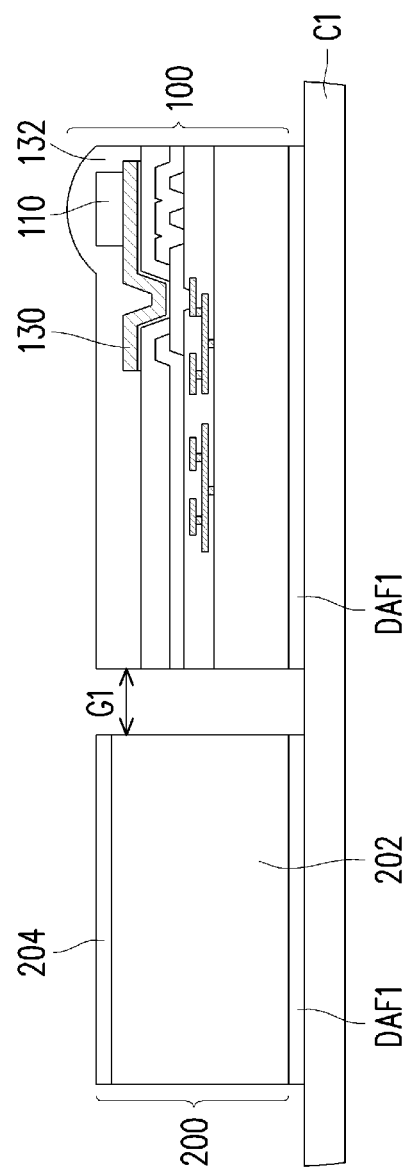
FIGS. 8 through 11 illustrate cross-sectional views of various processing steps during formation of a chip package in accordance with some embodiments.

Referring to FIG. 8, the singulated semiconductor die 100 and the dummy die 200 are mounted to a carrier C1 such as a glass substrate. The dummy die 200 acts as a supporting structure for a semiconductor die 300 that will be stacked thereon, as will be discussed with reference to FIGS. 10 through 13 below. In some embodiments, the semiconductor die 100 and dummy die 200 are disposed over the carrier C1 and adhered to the carrier C1 through a die attach film DAF1. In some embodiments, a de-bonding layer (not shown) such as a light-to-heat conversion (LTHC) release layer may be formed on the carrier C1 before attaching the dummy die 200 and the semiconductor die 100. The semiconductor die 100 and dummy die 200 are placed side-by-side on the carrier C1. Each of the semiconductor die 100 and its corresponding dummy die 200 are separated by a gap G1. In some embodiments, the gap G1 may be between about 20 μm to about 500 μm.

The dummy die 200 may include a substrate 202 and a dielectric layer 204 formed on the substrate 202. The substrate 202 may be formed of the same semiconductor material as the semiconductor substrate 20 of the semiconductor die 100, such as silicon for example. In some embodiments, the dielectric layer 204 is formed of the same material as the dielectric layer 132 of semiconductor die 100, such as polyimide (PI) layer, polybenzoxazole (PBO), or other suitable polymers. In some embodiments, the dummy die 200 and the semiconductor die 100 are substantially identical in thickness. In some embodiments, after attaching the semiconductor die 100 and the dummy die 200, the level height of the top surface of the substrate 202 is provided lower than the top surface of the conductive lines 130 and the top surface of dielectric layer 132, and the level height of the dielectric layer 204 may be provided substantially level to the top surface of the conductive vias 110. In some embodiment, the footprint of the dummy die 200 may be between about 0.5 to about 2 times that of the semiconductor die 100. Although, one semiconductor die 100 is shown, the number of semiconductor die 100 is not limited to one. That is, two identical semiconductor dies 100 may be positioned on the carrier such that their conductive vias 110 are aligned on the right edge.

Figure 9:
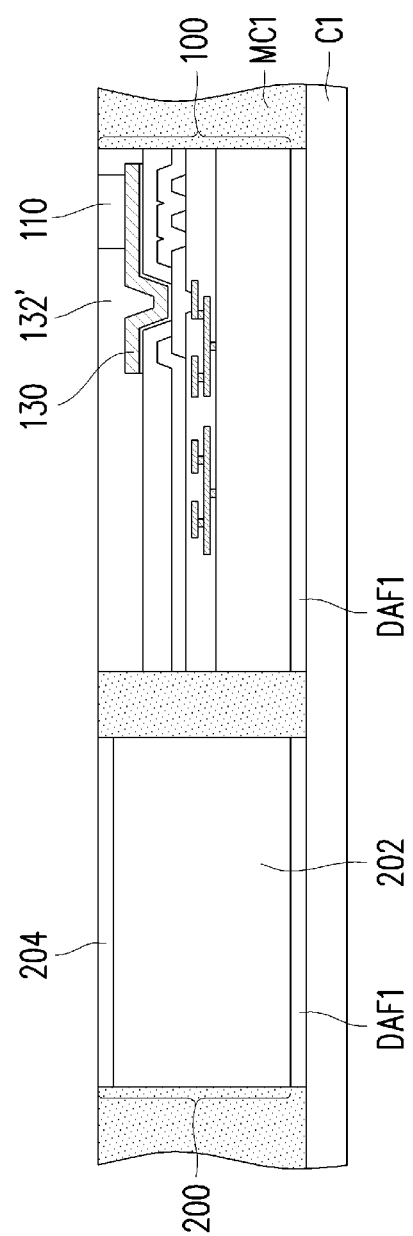

Referring to FIG. 9, after the semiconductor die 100 and the dummy die 200 are mounted on the carrier C1, an insulating encapsulant are formed to cover the carrier C1, the semiconductor die 100 and the dummy die 200. The insulating encapsulant may be a molding compound, epoxy, or the like, and may be applied by a molding process (e.g. compression molding, transfer molding, or the like). The insulating encapsulant may be applied to a level covering the top surfaces of the semiconductor dies 100 and dummy dies 200.

The insulating encapsulant, dielectric layer 132 and dielectric layer 204 is then partially removed to expose the top surfaces of the dielectric layer 132', the dielectric layer 204 and the conductive vias 110. Preferably, after partially removing the insulating encapsulant, the top surface of the remaining insulating encapsulant MC1 is substantially leveled with the exposed top surfaces of the dielectric layer 132', the dielectric layer 204 and the conductive vias 110. The partial removal of the insulating encapsulant may be performed by a grinding process and/or a planarization process such as a chemical mechanical polishing (CMP) process.

Figure 10:
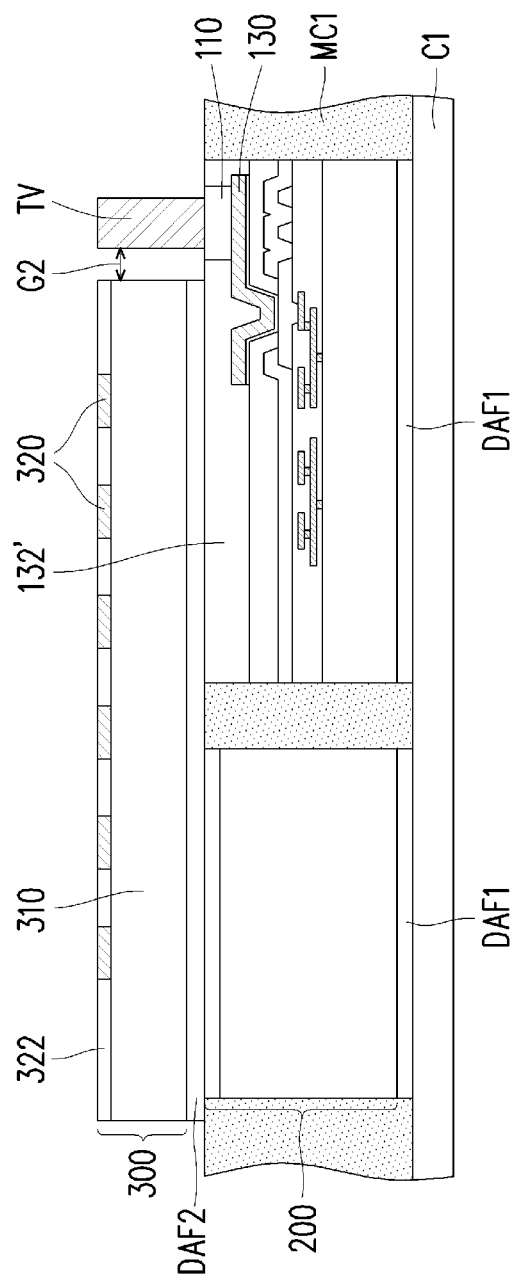

Referring to FIG. 10, through vias TV (or conductive pillars) are formed on the conductive vias 110 and a semiconductor die 300 is stacked on top of the semiconductor die 100, the dummy die 200 and the insulating encapsulant MC1.

The through vias TV may be formed using process similar to the process of forming conductive vias 110. In detail, a photoresist may be deposited over the semiconductor die 100, the dummy die 200 and the insulating encapsulant, and patterned to have openings that partially reveal the conductive vias 110. A conductive material is then formed in the openings of the photoresist and on the exposed portions of the conductive vias 110 such that through vias TV are formed on the conductive vias 110. In some embodiments, the through vias TV are formed of a metal such as copper, titanium, tungsten, aluminum, or the like. In some embodiments, the through vias TV may have a diameter smaller than the diameter of the conductive vias 110. After forming the through vias TV, the photoresist may be removed using a suitable ashing process, stripping process or the like. The through vias TV may be formed with a height greater than the thickness of the semiconductor die 300 to be attached in a later process, as discussed below.

After the through vias TV are formed, the semiconductor die 300 is then attached to the top surface of the semiconductor die 100, the top surface of the dummy die 200 and the top surface of the insulating encapsulant MC1, and positioned beside the through vias TV. In some embodiments, the semiconductor die 300 are System on Chip (SoC) dies. In some alternative embodiments, the semiconductor die 300 may be logic dies, which may be Central Processing Unit (CPU) dies, Micro Control Unit (MCU) dies, Input-Output (10) dies, BaseBand (BB) dies, or Application processor (AP) dies. Referring to FIG. 10, the semiconductor die 300 includes a semiconductor substrate 310 and conductive pads 320 provided on the semiconductor substrate 310. The semiconductor substrate 310 may be a silicon substrate including active components (e.g., transistors or the like) and passive components (e.g., resistors, capacitors, inductors or the like). The active components and passive components (not shown) are formed in or on the front side of the semiconductor substrate 310. In some embodiments, the semiconductor die 300 may be attached to the top surface of the semiconductor die 100, the top surface of the dummy die 200 and the top surface of the insulating encapsulant MC1 before forming the through vias TV.

Although not illustrated, the semiconductor die 300 may include interconnect structures similar to interconnect structures 30, which includes multiple layers of metal lines and metal vias embedded in dielectric material, so as to provide electrical connection to the active components and passive components that are formed in or on the front side of the semiconductor substrate 310. The conductive pads 320 formed over the semiconductor substrate 310 and may be regarded as I/O connection pads to the semiconductor substrate 310. The conductive pads 320 are embedded in dielectric layer 322. In some embodiments, the semiconductor die 300 may have a number of conductive pads 320 (i.e. I/O counts) higher than the number of through vias TV or conductive vias 110. The conductive pads 320 may be evenly distributed over the top surface of the semiconductor die 300. In some embodiments, the conductive pads 320 may cover a region of between 5% to 60% of the top surface area of the semiconductor die 300. In some embodiment, the number of conductive pads 320 is between about 10 to 100 times the number of through vias TV.

Figure 12:
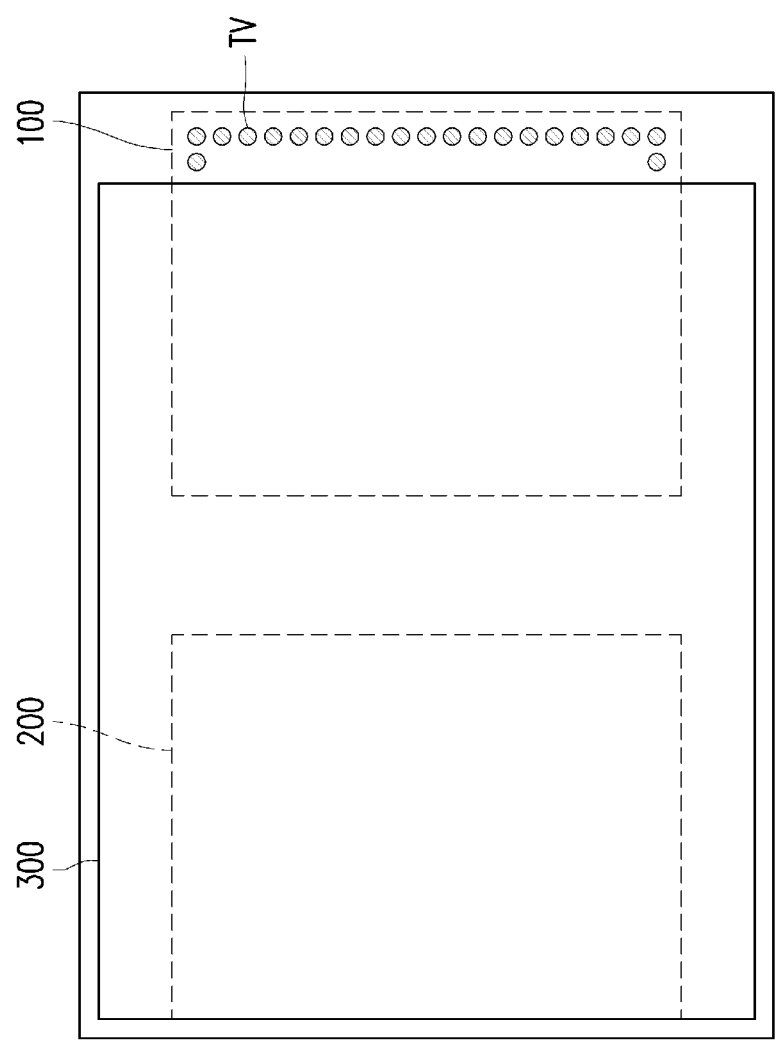
FIG. 12 illustrates top view of the chip package of FIG. 10 in accordance with some embodiments.

In addition to higher I/O count, the semiconductor die 300 covers a larger area than the semiconductor die 100. The semiconductor die 300 may positioned on the dielectric layer 132' and be separated from the through vias TV by a gap G2. In some embodiment, the gap G2 may be between about 10 μm to about 500 μm. In some embodiments, the semiconductor die 300 may be attached using a die attach film DAF2. In some embodiments, the sidewall of the semiconductor die 300 right beside through vias TV may be substantially parallel to the through vias lined along the right edge of the semiconductor die 100, such as shown in FIG. 12. Due to the semiconductor die 300 being larger than the semiconductor die 100, the semiconductor die 300 extends over the edge of the semiconductor die 100 opposing to the through vias TV (i.e. left edge of semiconductor die 100) and covers the dummy die 200. The dummy die 200 acts as a supporting structure for the semiconductor die 300 to ensure that the semiconductor die 300 remains level. In some embodiments, the left edge of semiconductor die 300 may further extend over the left edge of the dummy die 200. In some alternative embodiments, semiconductor die 300 may partially cover the dummy die 200.

Figure 11:
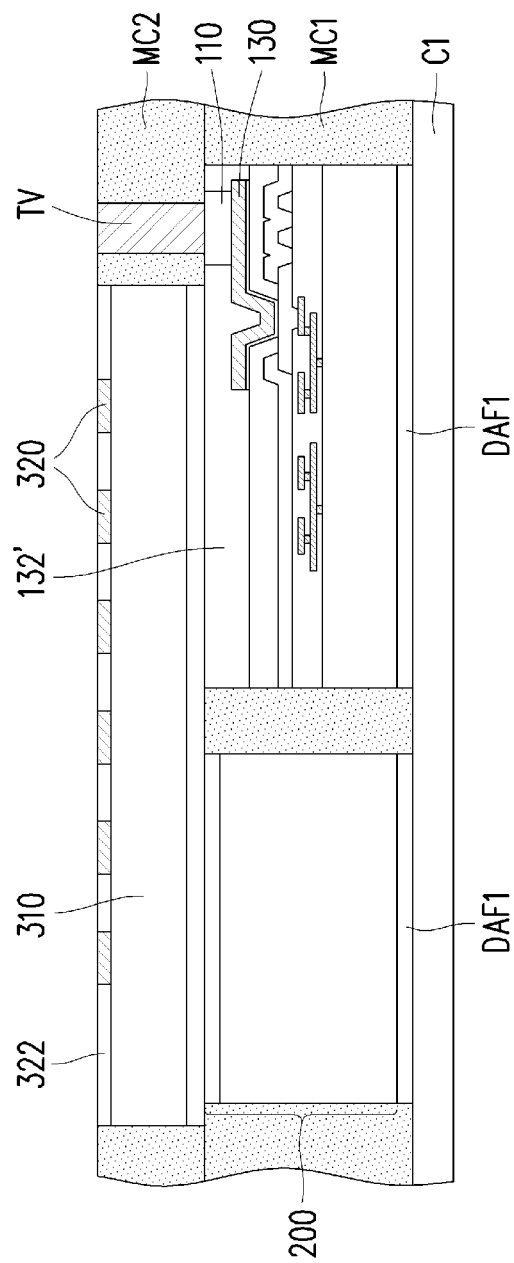

In FIG. 11, an insulating encapsulant is formed to cover the semiconductor dies 100, insulating encapsulant MC1, through vias TV, semiconductor dies 300 and dummy dies 200 (in a case when dummy die 200 is not completely covered by the semiconductor die 300). The insulating encapsulant may be a molding compound, epoxy, or the like, and may be applied by a molding process (e.g. compression molding, transfer molding, or the like). The insulating encapsulant may be applied to a level covering the top surfaces of the semiconductor dies 300 and through vias TV.

The insulating encapsulant is then partially removed to expose the top surfaces of the dielectric layer 322, the conductive pads 320 and the through vias TV. In some embodiment, when the through vias TV is taller than the top surface of the semiconductor die 300, the through vias TV is also partially removed. Preferably, after partially removing the insulating encapsulant, the top surface of the remaining insulating encapsulant MC2 is substantially leveled with the exposed top surfaces of the dielectric layer 322, the conductive pads 320 and the through vias TV. The partial removal of the insulating encapsulant may be performed by a grinding process and/or a planarization process such as a chemical mechanical polishing (CMP) process.

After the formation of the insulating encapsulant MC2, the chip package including the semiconductor die 100, the dummy die 200 and the semiconductor die 300 may have a top view illustrated in FIG. 12. For simplicity, the distribution of the conductive pads 320 on the semiconductor die 300 are not illustrated. Referring to FIG. 12, the through vias TV are provided along the right edge of the semiconductor die 100 located at positions corresponding to the conductive vias 110 of FIGS. 1 and 2. The semiconductor die 100 and the dummy die 200 are covered by the semiconductor die 300 as well as the insulating encapsulant MC2 and are represented by dashed lines. Although the semiconductor die 300 are shown as having a width greater than the length of both semiconductor die 100 and dummy die 200, this should not be regarded as limiting the sizes of the semiconductor die 100 and dummy die 200 relative to the semiconductor die 300. In some embodiments, the semiconductor die 300 may have a length greater than the length of the semiconductor die 100 and dummy die 200, but not a width greater than the length of the semiconductor die 100 and dummy die 200, such that the length of the semiconductor die 100 or the dummy die 200 may extend beyond the width of the semiconductor die 300. In some embodiments, the semiconductor die 300 may be placed offset along the length of the semiconductor die 100 such that an L-edge of the semiconductor die 100 is not covered by the semiconductor die 300.

Figure 13:
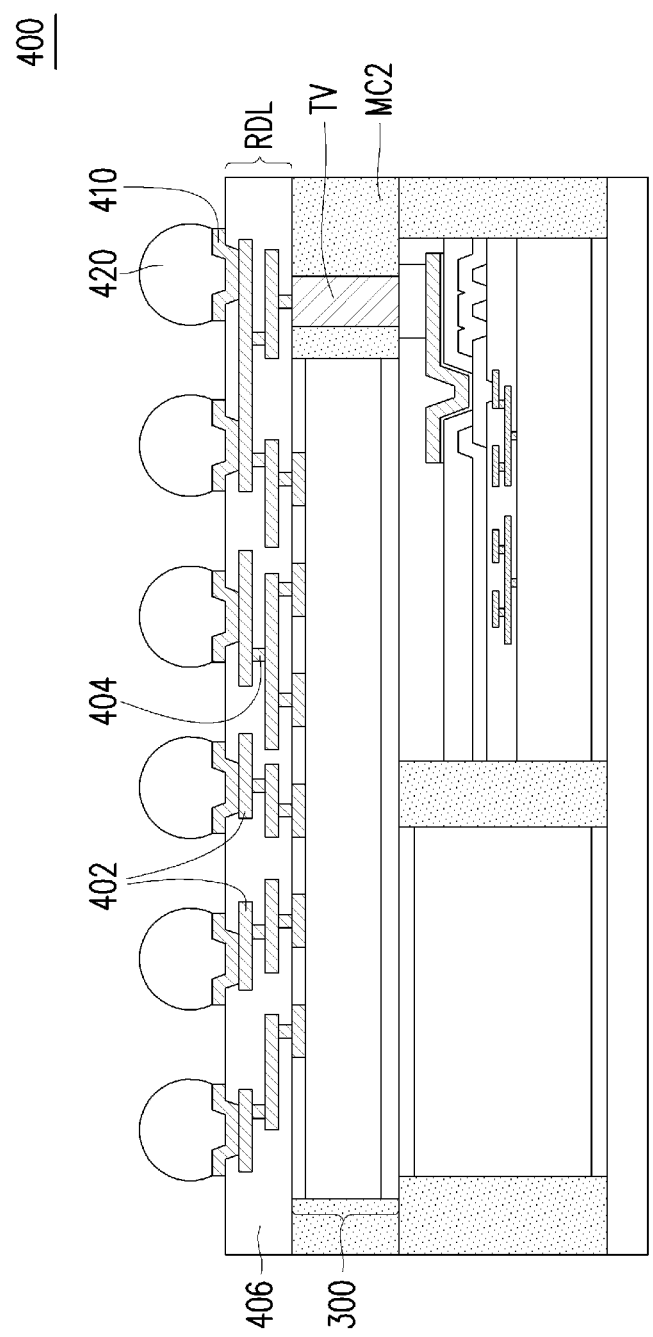
FIG. 13 illustrates cross-sectional views of a chip package in accordance with some embodiments.

Referring to FIG. 13, a redistribution circuit structure RDL is formed on the top surfaces of the through vias TV, the top surface of the insulating encapsulation MC2, and the top surface of the semiconductor dies 300. The redistribution circuit structure RDL is fabricated to electrically connect with one or more connectors underneath. Here, the aforesaid connectors may be conductive pads 320 and through vias TV embedded in the insulating encapsulant MC2. The redistribution circuit structure RDL may include a plurality of redistribution wirings and a plurality of patterned dielectric layers 406 stacked alternately. Here, the redistribution wirings may include conductive traces 402 and conductive vias 404 stacked alternately. For example, the material of the redistribution wirings may be copper and the material of the patterned dielectric layers 406 may include polyimide (PI), polybenzoxazole (PBO) or other suitable dielectric material. Furthermore, the through vias TV are electrically connected to the semiconductor die 300 through the redistribution circuit structure RDL.

After forming the redistribution circuit structure RDL, a plurality of conductive features electrically connected to the redistribution circuit structure RDL are formed. Here, the conductive features may include under-bump metallurgies (UBM) 410 and conductive connectors 420 formed on the UBM 410. In some embodiments, the conductive connectors 420 may be ball grid array (BGA) connectors, solder balls, metal pillars, controlled collapse chip connection (C4) bumps, micro bumps, or the like. The conductive connectors 420 may include conductive materials such as solder, copper, aluminum, gold, nickel, silver, palladium, tin, or the like, or the combination thereof. In some embodiments, the conductive connectors may be formed by initially forming a layer of solder on the UBM 410 followed by a reflow process. After forming the conductive connectors 420, a chip package 400 with front side redistribution structure is accomplished.

In the above-mentioned embodiments, forming the conductive vias 110 on semiconductor dies 100 before singulation prevents the fine-pitched conductive lines 100 from suffering from high stress due to a grinding process to planarize the top surface of the semiconductor die 100 and the dummy die 200. The dummy die 200 provides support for the semiconductor die 300, such that the larger semiconductor die 300 may be stacked on top of semiconductor die 100 without falling over. Further, providing a dummy die 200 with a substrate 202 formed of the same material as semiconductor substrate 20 of semiconductor die 100, the dummy die 200 may have the same coefficient of thermal expansion (CTE) as the semiconductor die 100, thus preventing semiconductor die 300 formed thereon from warping or delaminating during subsequent thermal processes involved in the formation of the RDL. By stacking the semiconductor die 300 over the semiconductor die 100 with front sides (i.e. side with active components) of both the semiconductor die 300 and semiconductor die 100 facing the same direction, a chip package having a smaller footprint and a shorter electrical connection path is achieved. That is, the through vias TV and conductive vias 110 disposed right beside the semiconductor die 300 provide a short electrical path between the semiconductor die 300 and the semiconductor die 100.

In accordance with some embodiments of the present disclosure, a chip package includes a first semiconductor die having a first dielectric layer and a plurality of conductive vias, the first dielectric layer having a first region and a second region, the conductive vias being embedded in the first region of the first dielectric layer; a plurality of conductive pillars disposed on and electrically connected to the conductive vias; a support structure; a second semiconductor die stacked over the support structure and the second region of the first dielectric layer; and an insulating encapsulant encapsulating the first semiconductor die, the second semiconductor die, the support structure and the conductive pillars, wherein the second semiconductor die is electrically connected to the first semiconductor die through the conductive pillars.

In accordance with some embodiments of the present disclosure, a chip package includes an insulating encapsulant; a first semiconductor die embedded in the insulating encapsulant, the first semiconductor die having a first dielectric layer and a plurality of conductive vias embedded in the first dielectric layer; a dummy die embedded in the insulating encapsulant; a plurality of conductive pillars disposed on the conductive vias and embedded in the insulating encapsulant; a second semiconductor die embedded in the insulating encapsulant, the second semiconductor die being stacked over the dummy die and covering a portion of the first dielectric layer, and the conductive pillars and the second semiconductor die being spaced apart from each other by a first portion of the insulating encapsulant; and a redistribution circuit structure disposed over the second semiconductor die, the insulating encapsulant and the conductive pillars, wherein the second semiconductor die is electrically connected to the first semiconductor die through the redistribution circuit structure and the conductive pillars.

In accordance with alternative embodiments of the present disclosure, a method of forming a chip package is provided. The method includes the following steps. Providing a support structure and a first semiconductor die over a carrier, the first semiconductor die having a first dielectric layer and a plurality of conductive vias covered by the first dielectric layer, the first dielectric layer having a first region and a second region, the conductive vias being embedded in the first region of the first dielectric layer; laterally encapsulating the support structure and the first semiconductor die with a first encapsulation portion; forming conductive pillars on the conductive vias; stacking a second semiconductor die over the support structure and the second region of the first dielectric layer; and laterally encapsulating the second semiconductor die and the conductive pillars with a second encapsulation portion, wherein the second semiconductor die is electrically connected to the first semiconductor die through the conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
    a first semiconductor die comprising a first dielectric layer and a plurality of conductive vias, the first dielectric layer comprising a first region and a second region, the conductive vias being embedded in the first region of the first dielectric layer;
    a plurality of conductive pillars disposed on and electrically connected to the conductive vias;
    a support structure;
    a second semiconductor die stacked over the support structure and the second region of the first dielectric layer; and
    an insulating encapsulant encapsulating the first semiconductor die, the second semiconductor die, the support structure and the conductive pillars, wherein the insulating encapsulant comprises:
        a first encapsulation portion laterally encapsulating the first semiconductor die and the support structure; and
        a second encapsulation portion connected to the first encapsulation portion and laterally encapsulating the second semiconductor die and the conductive pillars,
    wherein the second semiconductor die is electrically connected to the first semiconductor die through the conductive pillars.

2. The chip package as claimed in claim 1, wherein the support structure comprises a semiconductor substrate and a second dielectric layer disposed on the semiconductor substrate.

3. The chip package as claimed in claim 1, wherein the support structure and the second semiconductor die are substantially identical in thickness.

4. The chip package as claimed in claim 1, wherein the second semiconductor die is adhered with top surfaces of the support structure and the first semiconductor die through an adhesion layer.

5. The chip package as claimed in claim 1, wherein the support structure is spaced apart from the first semiconductor die.

6. The chip package as claimed in claim 1, wherein the second region of the first dielectric layer is free of conductive vias.

7. The chip package as claimed in claim 1, wherein top surfaces of the conductive pillars and a top surface of the second semiconductor die are substantially coplanar.

8. The chip package as claimed in claim 1, wherein a contact interface is between the first encapsulation portion and the second encapsulation portion, the contact interface is substantially level with a top surface of the support structure and a top surface of the first semiconductor die.

9. The chip package as claimed in claim 1, further comprising a redistribution circuit structure disposed over the second semiconductor die, the insulating encapsulant and the conductive pillars, wherein the second semiconductor die is electrically connected to the first semiconductor die through the redistribution circuit structure and the conductive pillars.

10. A chip package, comprising:
an insulating encapsulant;
a first semiconductor die embedded in the insulating encapsulant, the first semiconductor die comprising a first dielectric layer and a plurality of conductive vias embedded in the first dielectric layer;
a dummy die embedded in the insulating encapsulant;
a plurality of conductive pillars disposed on the conductive vias and embedded in the insulating encapsulant;
a second semiconductor die embedded in the insulating encapsulant, the second semiconductor die being stacked over the dummy die and covering a portion of the first dielectric layer, and the conductive pillars and the second semiconductor die being spaced apart from each other by a first portion of the insulating encapsulant; and
a redistribution circuit structure disposed over the second semiconductor die, the insulating encapsulant and the conductive pillars, wherein the second semiconductor die is electrically connected to the first semiconductor die through the redistribution circuit structure and the conductive pillars.

11. The chip package as claimed in claim 10, wherein the dummy die and the first semiconductor die being spaced apart from each other by a second portion of the insulating encapsulant.

12. The chip package as claimed in claim 11, wherein the dummy die and the first semiconductor die are substantially identical in coefficient of thermal expansion (CTE).

13. The chip package as claimed in claim 11, wherein the dummy die and the second semiconductor die are substantially identical in thickness.

14. The chip package as claimed in claim 11, wherein the second semiconductor die is adhered with top surfaces of the dummy die and the first semiconductor die through an adhesion layer.

15. The chip package as claimed in claim 11, wherein the portion of the first dielectric layer covered by the second semiconductor die is free of conductive vias.

16. The chip package as claimed in claim 11, wherein the insulating encapsulant comprises a first encapsulation portion and a second encapsulation portion connected to the first encapsulation portion,
the first semiconductor die and the dummy die are embedded in the first encapsulation portion, and
the second semiconductor die and the conductive pillars are embedded in the second encapsulation portion.

17. The chip package as claimed in claim 16, wherein an interface is between the first encapsulation portion and the second encapsulation portion, the contact interface is substantially level with a top surface of the dummy die and a top surface of the first semiconductor die.

18. A method of forming a chip package, comprising:
providing a support structure and a first semiconductor die over a carrier, the first semiconductor die comprising a first dielectric layer and a plurality of conductive vias covered by the first dielectric layer, the first dielectric layer comprising a first region and a second region, the conductive vias being embedded in the first region of the first dielectric layer;
laterally encapsulating the support structure and the first semiconductor die with a first encapsulation portion;
forming conductive pillars on the conductive vias;
stacking a second semiconductor die over the support structure and the second region of the first dielectric layer; and
laterally encapsulating the second semiconductor die and the conductive pillars with a second encapsulation portion, wherein the second semiconductor die is electrically connected to the first semiconductor die through the conductive pillars.

19. The method for forming a chip package as claimed in claim 18, wherein laterally encapsulating the support structure and the first semiconductor die with the first encapsulation portion comprises:
forming an insulating material on the carrier to encapsulate the support structure and the first semiconductor die; and
partially removing the insulating material and the first dielectric layer to reveal the support structure and the conductive vias of the first semiconductor die to form the first encapsulation portion.

20. The method for forming a chip package as claimed in claim 18, further comprising:
forming a redistribution circuit structure over the second semiconductor die and the conductive pillars, wherein the redistribution circuit structure electrically connects the second semiconductor die to the conductive pillars.

* * * * *